(12) United States Patent
Chou et al.

(10) Patent No.: US 12,675,137 B2
(45) Date of Patent: Jul. 7, 2026

(54) ELECTRONIC DEVICE

(71) Applicant: Getac Technology Corporation, New Taipei City (TW)

(72) Inventors: Hsin-Chih Chou, Taipei (TW); Juei-Chi Chang, Taipei (TW)

(73) Assignee: Getac Technology Corporation, New Taipei City (TW)

( * ) Notice: Subject to any disclaimer, the term of this patent is extended or adjusted under 35 U.S.C. 154(b) by 142 days.

(21) Appl. No.: 18/610,018

(22) Filed: Mar. 19, 2024

(65) Prior Publication Data

US 2024/0393837 A1     Nov. 28, 2024

(30) Foreign Application Priority Data

May 25, 2023     (CN) .......................... 202310600028.8

(51) Int. Cl.
   G06F 1/16          (2006.01)
   H05K 5/03          (2006.01)
(52) U.S. Cl.
   CPC ............. G06F 1/1656 (2013.01); H05K 5/03 (2013.01)
(58) Field of Classification Search
   CPC ...... G06F 1/1656; H05K 5/03; H05K 5/0217; H05K 5/061; H04M 1/0249; H04M 1/18
   See application file for complete search history.

(56) References Cited

U.S. PATENT DOCUMENTS

| | | | | | |
|---|---|---|---|---|---|
| 9,213,370 | B2 * | 12/2015 | Yamaguchi | .............. | H05K 5/06 |
| 9,909,035 | B1 * | 3/2018 | Caldeira | .................. | B32B 5/18 |
| 10,477,306 | B2 * | 11/2019 | Seo | .......................... | H04R 1/44 |
| 10,665,924 | B2 * | 5/2020 | Son | .......................... | H01Q 9/42 |
| 10,820,094 | B2 * | 10/2020 | Park | ........................ | H04M 1/03 |
| 11,611,141 | B2 * | 3/2023 | Son | .......................... | H01Q 9/04 |
| 2012/0322516 | A1 * | 12/2012 | Kitagawa | ................ | H04M 1/18 |
| | | | | | 361/679.01 |
| 2013/0029147 | A1 * | 1/2013 | Miki | ................. | C08F 220/1808 |
| | | | | | 428/355 CN |
| 2013/0088818 | A1 * | 4/2013 | Yamaguchi | ................ | C09J 7/30 |
| | | | | | 361/679.01 |
| 2015/0030797 | A1 * | 1/2015 | Seo | .......................... | B32B 5/26 |
| | | | | | 264/10 |
| 2015/0155614 | A1 | 6/2015 | Youn et al. | | |
| 2015/0212554 | A1 | 7/2015 | Mori et al. | | |

(Continued)

FOREIGN PATENT DOCUMENTS

| | | | |
|---|---|---|---|
| CN | 113853087 | A | 12/2021 |
| CN | 114929824 | A | 8/2022 |

(Continued)

*Primary Examiner* — Imani N Hayman
*Assistant Examiner* — Theron S Milliser
(74) *Attorney, Agent, or Firm* — Cooper Legal Group, LLC

(57)          ABSTRACT

An electronic device includes a casing, a cover, and a waterproof element. The casing has an opening. The cover is covered and assembled at the opening. The waterproof element includes a double-sided tape and an elastic body. The double-sided tape includes a first substrate, a first adhesive layer, and a second adhesive layer. The first adhesive layer and the second adhesive layer are coated on two opposite surfaces of the first substrate, respectively. The elastic body is fixed on the casing or the cover, adhered to the second adhesive layer, and tightly fitted to the cover or the casing repeatedly through the first adhesive layer.

20 Claims, 5 Drawing Sheets

(56) References Cited

U.S. PATENT DOCUMENTS

| 2016/0233573 | A1* | 8/2016 | Son | H01Q 1/243 |
|---|---|---|---|---|
| 2017/0026742 | A1* | 1/2017 | Karube | A45C 11/22 |
| 2018/0242079 | A1* | 8/2018 | Seo | H04M 1/03 |
| 2020/0287275 | A1* | 9/2020 | Son | H01Q 9/42 |
| 2022/0224783 | A1 | 7/2022 | Lee et al. | |
| 2022/0304176 | A1 | 9/2022 | Yuan et al. | |
| 2023/0078037 | A1* | 3/2023 | Zhang | H04M 1/026 |
| | | | | 455/575.3 |
| 2024/0393837 | A1* | 11/2024 | Chou | G06F 1/1656 |

FOREIGN PATENT DOCUMENTS

| EP | 4084447 | A1 | 11/2022 |
|---|---|---|---|
| JP | 2009188488 | A | 8/2009 |

* cited by examiner

ELECTRONIC DEVICE

CROSS-REFERENCE TO RELATED APPLICATION

This non-provisional application claims priority under 35 U.S.C. § 119 (a) to Patent Application No. 202310600028.8, filed in China, P.R.C. on May 25, 2023, the entire contents of which are hereby incorporated by reference.

BACKGROUND OF THE INVENTION

The present disclosure relates to an electronic device, in particular, to an electronic device with a repeatedly detachable waterproof cover.

For the demands on the expandability or replaceability of the electronic devices, in general, an electronic device is provided with a detachable cover (such as a detachable rear cover or a detachable side cover). Therefore, the user can replace the components inside the electronic device or can additionally assemble other components inside the electronic device according to different requirements.

SUMMARY OF THE INVENTION

For retaining the waterproof function of an electronic device with a detachable cover, a waterproof element can be provided on the waterproof surface of the detachable cover to increase the waterproof performance. However, if a higher waterproof demand is to be achieved, simply adding a waterproof element (such as a waterproof foam or a waterproof elastic body) may be still not enough to pass the performance test for the high waterproof demand. In view of this, in one embodiment of the present disclosure, an electronic device with a waterproof cover is provided. The electronic device comprises a casing, a cover, and a waterproof element. The casing has an opening. The cover is covered and assembled at the opening. The waterproof element comprises a double-sided tape and an elastic body. The double-sided tape comprises a first substrate, a first adhesive layer, and a second adhesive layer, wherein the first adhesive layer and the second adhesive layer are coated on two opposite surfaces of the first substrate. The elastic body is fixed on the casing or the cover, the elastic body is adhered to the second adhesive layer, and the elastic body is tightly fitted to the cover or the casing repeatedly through the first adhesive layer.

In some embodiments, the elastic body is fixed on the cover, and the elastic body is tightly fitted to the casing repeatedly through the first adhesive layer. A first adhesion force between the casing and the first adhesive layer is less than a second adhesion force between the second adhesive layer and the elastic body, and the first adhesion force is adapted to allow the elastic body to be adhered to or peeled from the casing repeatedly through the first adhesive layer.

In some embodiments, the casing has a close-fit structure, and the close-fit structure is adapted to press the elastic body.

In some embodiments, the close-fit structure is a protruding rib surrounding the opening, and the protruding rib forward presses the elastic body through the first adhesive layer.

In some embodiments, the waterproof element further comprises another double-sided tape, the another double-sided tape comprises a second substrate, a third adhesive layer, and a fourth adhesive layer, wherein the third adhesive layer and the fourth adhesive layer are respectively coated on two opposite surfaces of the second substrate. The third adhesive layer is adhered to the elastic body, and the fourth adhesive layer is adhered to the cover. Both an adhesion force between the third adhesive layer and the elastic body and an adhesion force between the fourth adhesive layer and the cover are greater than the first adhesion force between the casing and the first adhesive layer.

In some embodiments, the elastic body is fixed on the casing, and the elastic body is tightly fitted to the cover repeatedly through the first adhesive layer. A first adhesion force between the cover and the first adhesive layer is less than a second adhesion force between the second adhesive layer and the elastic body, and the first adhesion force is adapted to allow the elastic body to be adhered to or peeled from the cover repeatedly through the first adhesive layer.

In some embodiments, the cover has a close-fit structure, and the close-fit structure is adapted to press the elastic body. The close-fit structure is a plurality of protruding ribs, the protruding ribs surround an outer periphery of the cover and are spaced apart from each other, and the protruding ribs forward press the elastic body through the first adhesive layer.

In some embodiments, the elastic body is a foam or a rubber.

In some embodiments, a hardness of the elastic body is less than a hardness of the cover and less than a hardness of the casing.

To sum up, according to one or some embodiments of the present disclosure, through configuring a double-sided tape on a surface of the waterproof element mated with the casing or the cover, the cover and the casing can be closely mated with each other so as to enhance the waterproof performance. Furthermore, in some embodiments, through adopting the double-sided tape which allows the first adhesive layer to be closely fitted to the cover or the casing repeatedly (for example, an adhesive layer with lower adhesion strength), when the cover is to be disassembled from the casing again due to repair requirement or various usage requirements, even if the cover is repeatedly assembled to or disassembled from the casing, the repeatedly assembling/disassembling does not cause the waterproof element to be damaged which may be occur owing to the excessive adhesion strength of the adhesive layer.

DETAILED DESCRIPTION OF THE INVENTION

Figure 1:
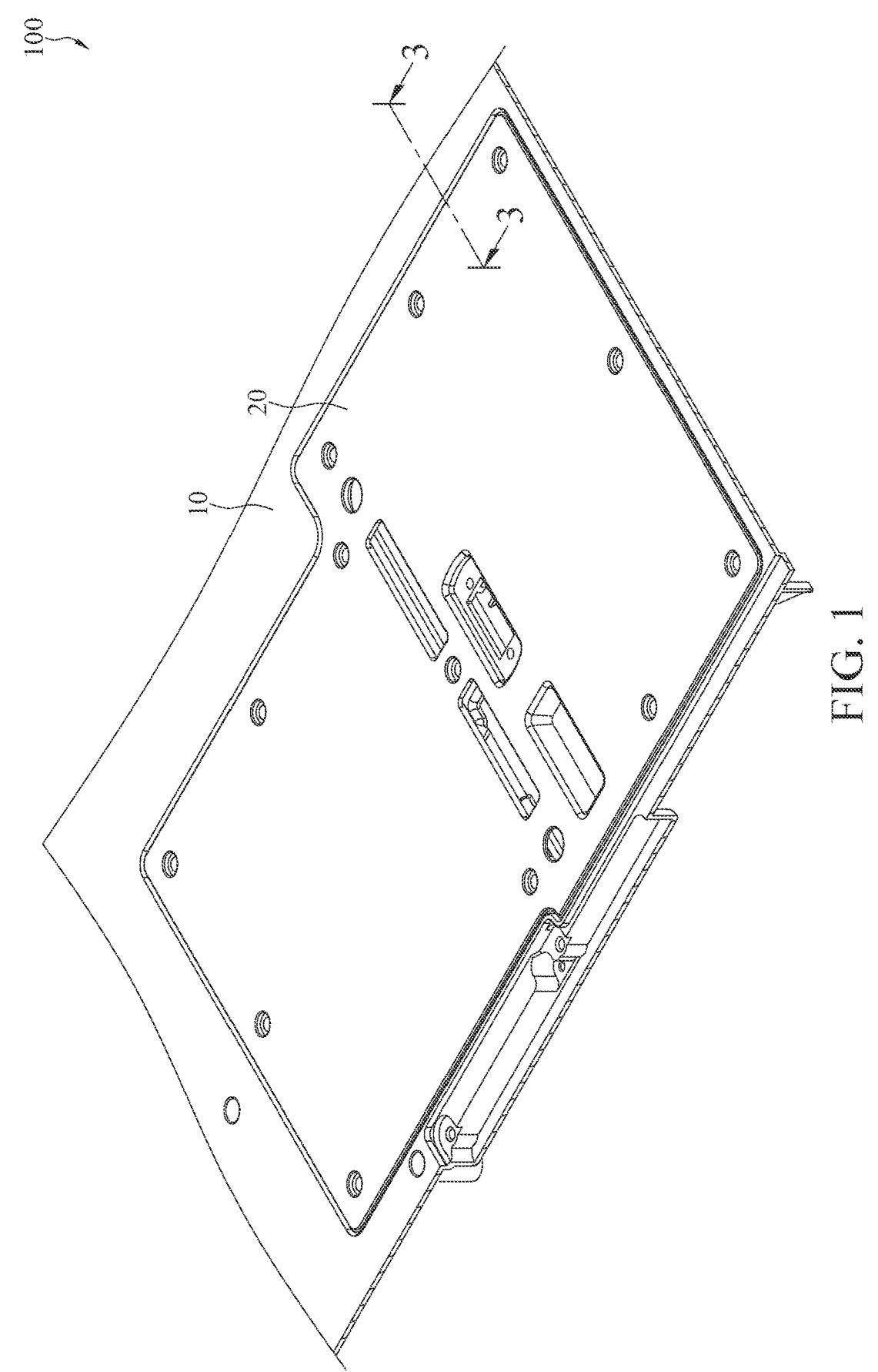
FIG. 1 illustrates a partial perspective view of an electronic device according to an embodiment of the present disclosure, where the cover is assembled on the casing.
Figure 2:
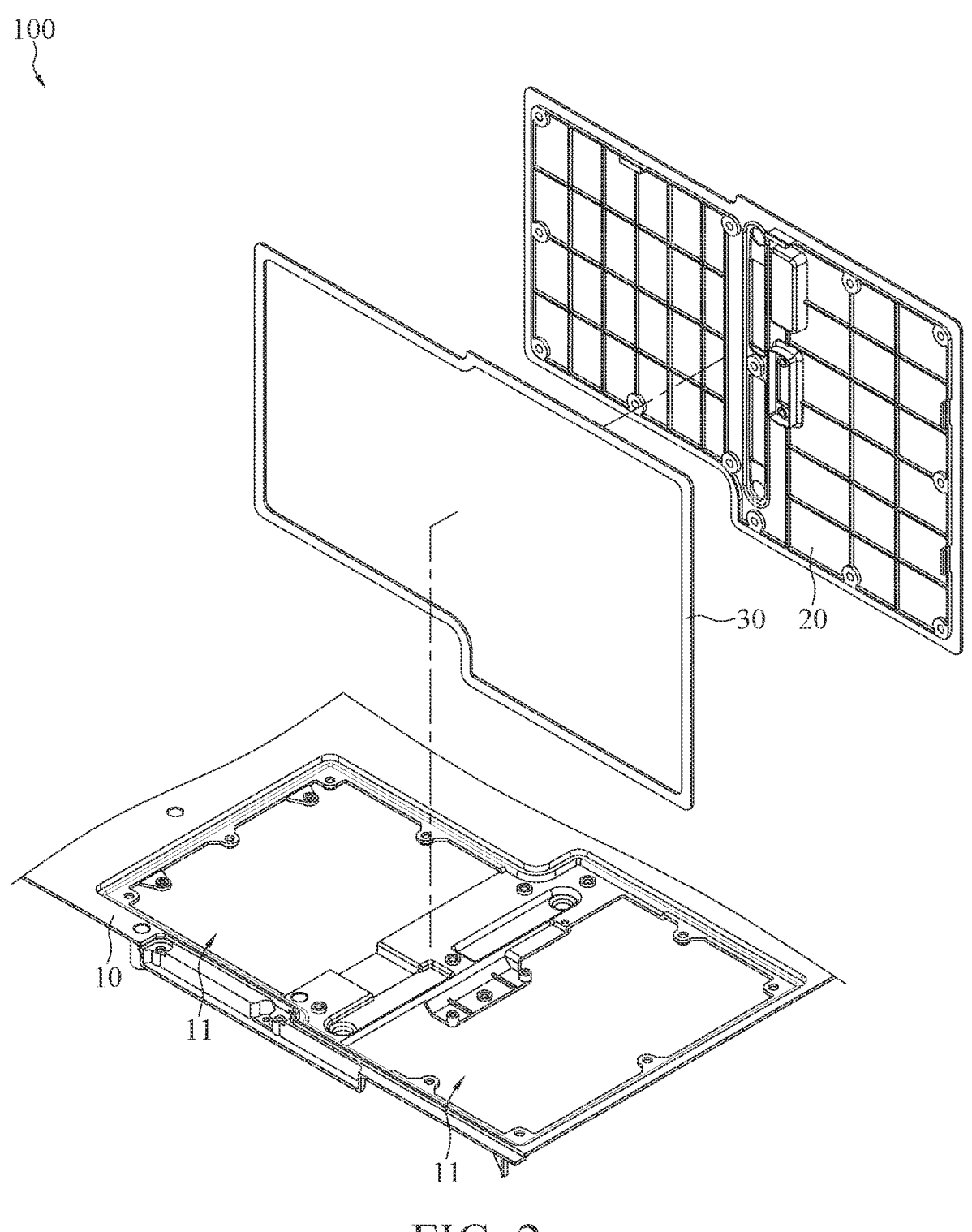
FIG. 2 illustrates an exploded partial view of the electronic device according to the embodiment of the present disclosure.
Figure 3:
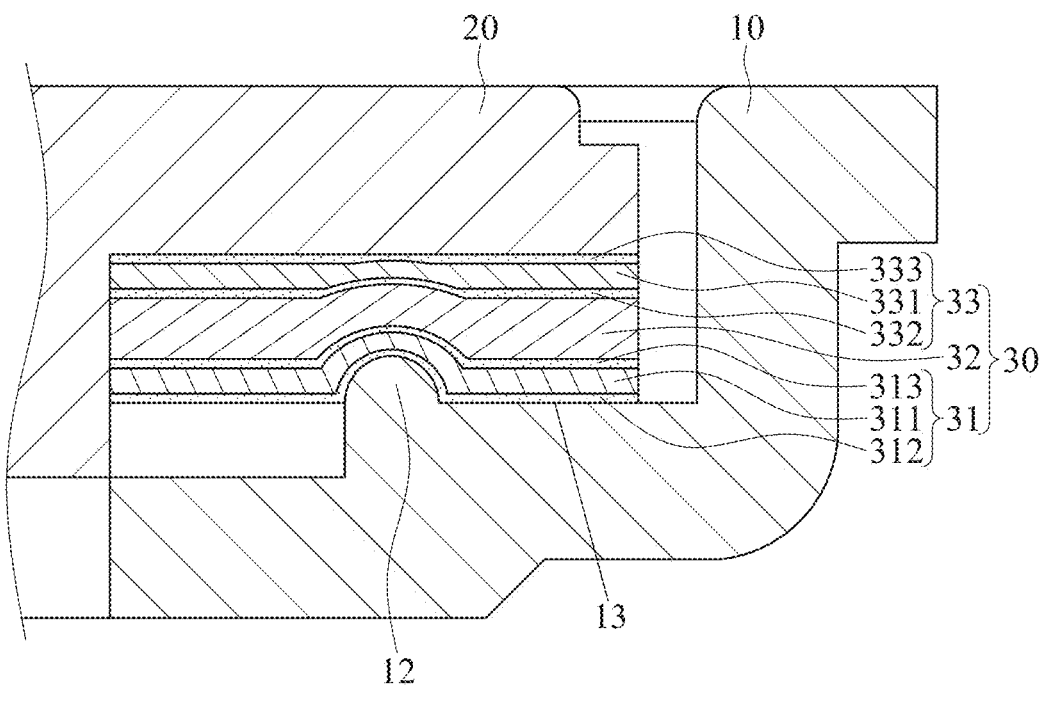
FIG. 3 illustrates a cross-sectional view of the electronic device according to the embodiment of the present disclosure, where the cover is assembled on the casing.

Please refer to FIG. 1 to FIG. 3. FIG. 1 illustrates a partial perspective view of an electronic device according to an embodiment of the present disclosure, where the cover is assembled on the casing. FIG. 2 illustrates an exploded partial view of the electronic device according to the embodiment of the present disclosure. FIG. 3 illustrates a cross-sectional view of the electronic device according to the embodiment of the present disclosure, where the cover is assembled on the casing. It is understood that, in FIG. 3, for clearly showing the detail structures of the electronic device 100, the sectioned part of the waterproof element 30 is not illustrated by using actual proportions; instead, the detail structures of the waterproof element 30 at the sectioned part are illustrated in an exaggerated manner. As shown in FIG. 1, in this embodiment, the electronic device 100 comprises a casing 10, a cover 20, and a waterproof element 30. The electronic device 100 may be for example, a notebook computer, an expandable electronic module, an expandable server, or the like, wherein the electronic device (such as a notebook computer) is provided with additional or enhanced functions (for example, battery, hard drive, disc player, display card, processor, or the like).

The casing 10 has an opening 11, and the cover 20 is covered and assembled at the opening 11. The opening 11 may be of any shape, and likewise the cover 20 may be of any shape, as long as the cover 20 can completely cover the opening 11. Moreover, the cover 20 may cover a plurality of opening 11 at the same time. The waterproof element 30 may be disposed on an outer periphery of the cover 20 or may be disposed on a portion of the casing 10 corresponding to an outer periphery of the opening 11, depending on the shape of the opening 11 to be covered by the waterproof element 30. In this embodiment, as an illustrative example, the waterproof element 30 is disposed on the cover 20.

The waterproof element 30 comprises a double-sided tape 31 and an elastic body 32. The double-sided tape 31 comprises a first substrate 311, a first adhesive layer 312, and a second adhesive layer 313, wherein the first adhesive layer 312 and the second adhesive layer 313 are coated on two opposite surfaces of the first substrate 311, respectively. The elastic body 32 is fixed on the cover 20, the clastic body 32 is adhered to the second adhesive layer 313, and the elastic body 32 is tightly fitted to the casing 10 repeatedly through the first adhesive layer 312.

Accordingly, when the cover 20 is to be covered and assembled at the opening 11, on one hand the cover 20 can be assembled on the opening 11 in a close-fit manner through the elastic body 32 of the waterproof element 30, and on the other hand the double-sided tape 31 allows the elastic body 32 and the casing 10 to be closely mated with each other, so that the mating between the elastic body 32 and the casing 10 is almost seamless. Moreover, by allowing the elastic body 32 and the casing 10 to be closely fitted with each other through the double-sided tape 31, during the operation of the electronic device 100, the impact applied to the electronic device 100, which may cause the displacement of the elastic body 32 to affect the waterproof performance, can be reduced.

Moreover, because the first adhesive layer 312 is an adhesive member which can be closely fitted to the casing 10, during repairing the electronic device 100 or repeatedly assembling/disassembling the cover 20, the repeatedly assembling/disassembling can be still achieved without causing the waterproof element 30 to be damaged which may be occur owing to the excessive adhesion strength of the first adhesive layer 312. Moreover, because the elastic body 32 is fixed on the cover 20, even if the elastic body 32 is damaged, the cover 20 (including the elastic body 32) can be replaced by a new one. Therefore, when the clastic body

32 is damaged, the user does not necessarily need to replace the whole electronic device 100 or to replace the cover 20 along with the casing 10.

In this embodiment, when the cover 20 is assembled on the casing 10 corresponding to the opening 11, the first adhesive layer 312 is adhered to the casing 10. Moreover, a first adhesion force between the casing 10 and the first adhesive layer 312 is less than a second adhesion force between the second adhesive layer 313 and the clastic body 32. Furthermore, the first adhesion force is adapted to allow the elastic body 32 to be adhered to or peeled from the casing 10 repeatedly through the first adhesive layer 312. Specifically, in this embodiment, because the second adhesion force is greater than the first adhesion force, the adhesion strength between the elastic body 32 and the first substrate 311 is greater than the adhesion strength between the first substrate 311 and the casing 10. When the cover 20 is to be disassembled from the casing 10, because a higher adhesion strength is between the elastic body 32 and the double-sided tape 31 and a lower adhesion strength is between the double-sided tape 31 and the casing 10, the first adhesive layer 312 adjacent to the casing 10 is firstly peeled from the casing 10. Therefore, the double-sided tape 31 can be prevented from detaching off the elastic body 32, which thus causes the cover 20 cannot be adhered to the casing 10 again. Moreover, with such configuration, the first adhesive layer 312 can be prevented being adhered to the casing 10, which thus drives the clastic body 32 to be detached form the cover 20 and makes the elastic body 32 damaged. Accordingly, in some embodiments, through choosing an adhesive layer with a proper adhesion force, the cover 20 can be closely fitted to the casing 10 repeatedly.

In one or some embodiments, the material of the casing 10 may be magnesium-aluminum metal alloy or plastic, and the elastic body 32 may be a foam or a rubber. In this embodiment, for illustrative purpose, the casing 10 is made of magnesium-aluminum metal alloy, and the elastic body 32 is a foam. Under such configuration, a first adhesive layer 312 having a first adhesion force of 0.45±0.2 Kg/25 mm and a second adhesive layer 313 having a second adhesion force of ≥1.3 Kg/25 mm can be adopted. In this embodiment, the adhesion forces are values obtained through performing tests on the adhesive layers according ASTM D3330 standard, and the testing substrate is SUS (stainless steel). In some other embodiments, the first adhesion force and the second adhesion force may be chosen as different values depending to the materials of the casing 10 and the elastic body 32, as long as the first adhesion force is less than the second adhesion force.

Next, please refer to FIG. 3. The casing 10 may have a close-fit structure 12 that protrudes above a planar surface 13 of the casing 10 to which the first adhesive 312 contacts, and the close-fit structure 12 is adapted to press the elastic body 32 due to the close-fit structure 12 protruding above the planar surface 13. In this embodiment, the close-fit structure 12 is a protruding rib, and the protruding rib surrounds the opening 11 and forward presses the elastic body 32 through the first adhesive layer 312. In some other embodiments, the close-fit structure 12 may be of other structures, such as a plurality of protruding spots. Therefore, by pressing the elastic body 32 with the close-fit structure 12, the contact between the elastic body 32 and the casing 10 can be achieved more closely.

Please further refer to FIG. 3. In this embodiment, the waterproof element 30 further comprises another double-sided tape 33. The another double-sided tape 33 comprises a second substrate 331, a third adhesive layer 332, and a fourth adhesive layer 333, wherein the third adhesive layer 332 and the fourth adhesive layer 333 are coated on two opposite surfaces of the second substrate 331, respectively. The third adhesive layer 332 is adhered to the elastic body 32, and the fourth adhesive layer 333 is adhered to the cover 20. The elastic body 32 of the waterproof element 30 may be integrally formed on the cover 20 through injection molding techniques. Alternatively, as in this embodiment, the waterproof element 30 may be fixed on the cover 20 by adhesion through the another double-sided tape 33. Under the configuration that the waterproof element 30 is adhered to the cover 20, if the waterproof element 30 is damaged, the user can just replace the waterproof element 30, rather than the whole cover 20.

Moreover, both an adhesion force between the third adhesive layer 332 and the elastic body 32 and an adhesion force between the fourth adhesive layer 333 and the cover 20 are greater than the first adhesion force between the casing 10 and the first adhesive layer 312. For example, an adhesive layer with an adhesion force equal to the second adhesion force or greater than the first adhesion force is provided as the third adhesive layer 323 and the fourth adhesive layer 324. Therefore, when the cover 20 is to be peeled from the casing 10, the cover 20 can be prevented from being peeled at the third adhesive layer 332 and the fourth adhesive layer 333.

Moreover, in order to allow the elastic body 32 to provide the close-fit performance, the hardness of the elastic body 32 is less than the hardness of the cover 20 and the hardness of the casing 10. Therefore, when the cover 20 is covered on the casing 10 so that the cover 20 forces the elastic body 32 to press the casing 10, with the softer material property of the elastic body 32, the elastic body 32 can be deformed elastically to allow the elastic body 32 to closely press the casing 10.

In order to ensure that the property of the material of the component can meet the application scenarios, following assembling/disassembling tests are performed. The first test scenario is performed under room temperature, and the judgment basis is whether the elastic body 32 is broken or damaged after the assembling/disassembling test. The test results for the first test scenario are provided as Table 1 below.

TABLE 1

| criteria | 1 hour after assembling | First assembling/disas-sembling | Second assembling/disas-sembling | Third assembling/disas-sembling |
|---|---|---|---|---|
| Not broken or damaged | ○ | ○ | ○ | ○ |

Wherein, the criterion "1 hour after assembling" indicates that after the cover 20 has been manually covered and assembled at the casing 10 for one hour, the cover 20 is disassembled from the casing 10. The criterion "first assembling/disassembling" indicates that after the cover 20 is covered and assembled at the casing 10, the cover 20 is disassembled from the casing 10 immediately. The criteria "second assembling/disassembling" and "third assembling/disassembling" apply the same. It is found that, either the criterion that the cover 20 has been covered and assembled at the casing 10 for one hour or the criteria of one or several times of assembling/disassembling, the cover 20 can be assembled/disassembled properly, and the elastic body 32 is not broken or damaged.

Moreover, to meet different application scenarios, the electronic device 100 is also simulated to be placed under different ambient conditions. The second test scenario is that, after the cover 20 is covered and assembled at the casing 10, the electronic device 100 is placed under a temperature of 40 degree Celsius for 24 hours and then placed under a temperature of −31 degree Celsius for 4 hours, and then the cover 20 is disassembled from the casing 10. The test results for the second test scenario are provided as Table 2 below.

TABLE 2

| criteria | Second test scenario | First assembling/disassembling | Second assembling/disassembling | Third assembling/disassembling |
|---|---|---|---|---|
| Not broken or damaged | ○ | ○ | ○ | ○ |

From Table 2, it is found that, even if the extreme temperature treatment is applied to the electronic device 100 plus several times of assembling/disassembling are performed on the electronic device 100, the cover 20 can still be assembled/disassembled properly, and the elastic body 32 is not broken or damaged.

Moreover, a thermal shock test is also applied to the electronic device 100 and the assembling/disassembling is then performed. Under such test scenario, the cover 20 can still be assembled/disassembled properly, and the elastic body 32 is not broken or damaged.

Based on the above, through the configuration of one or some embodiments of the present disclosure, the cover 20 can be repeatedly assembled/disassembled while still possesses the waterproof function. Therefore, when the cover 20 is to be disassembled from the casing 10 again due to repair requirement or various usage requirements for the electronic device 100, even if the cover 20 is repeatedly assembled to or disassembled from the casing 10, the repeatedly assembling/disassembling does not cause the waterproof element 30 to be damaged which may be occur owing to the excessive adhesion strength of the adhesive layer. Therefore, the service life of the product can be prolonged. Furthermore, the user does not necessarily need to replace the waterproof element 30 or even the whole cover 20 or the whole casing 10 after each assembling/disassembling.

Figure 4:
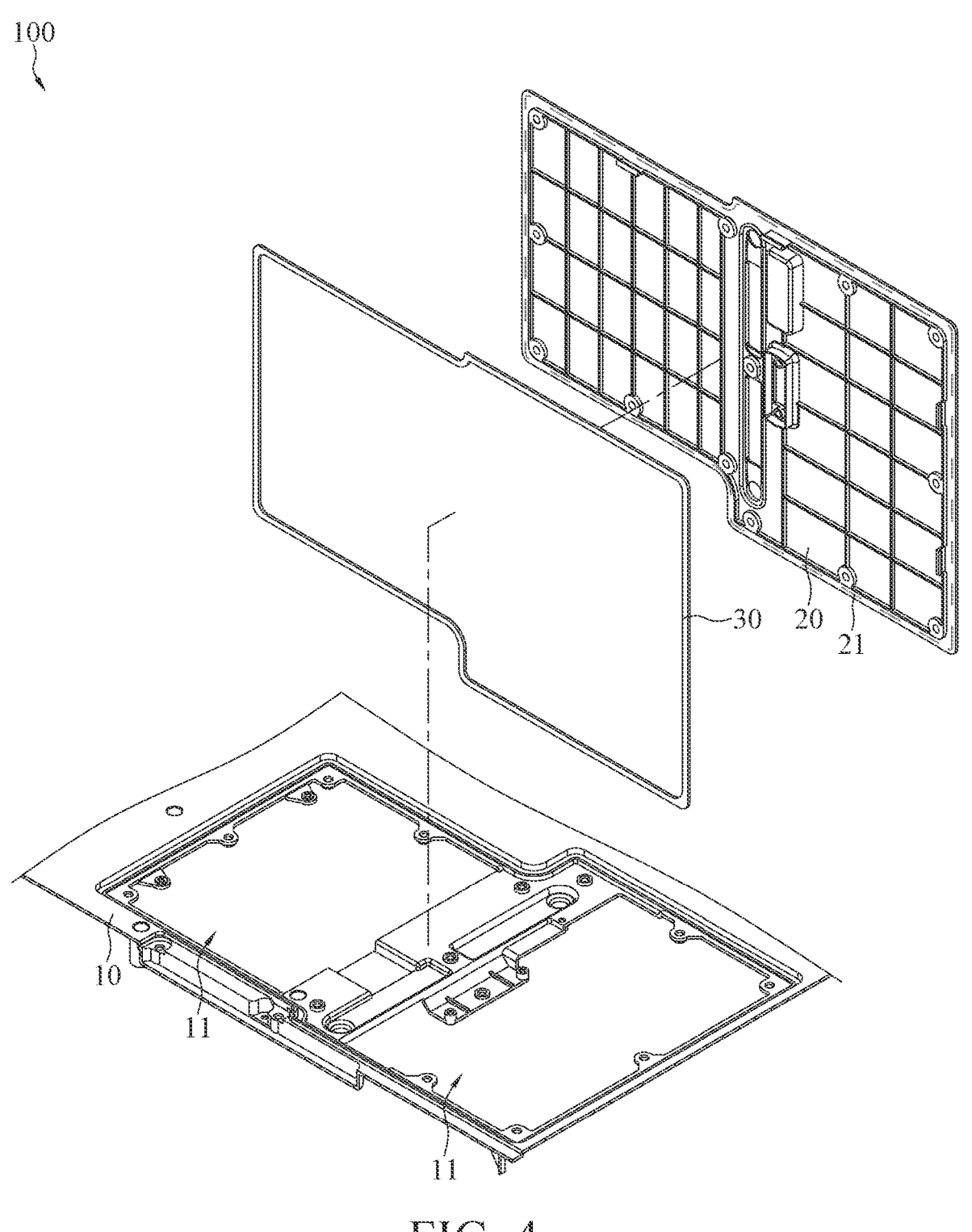
FIG. 4 illustrates an exploded partial view of an electronic device according to another embodiment of the present disclosure.
Figure 5:
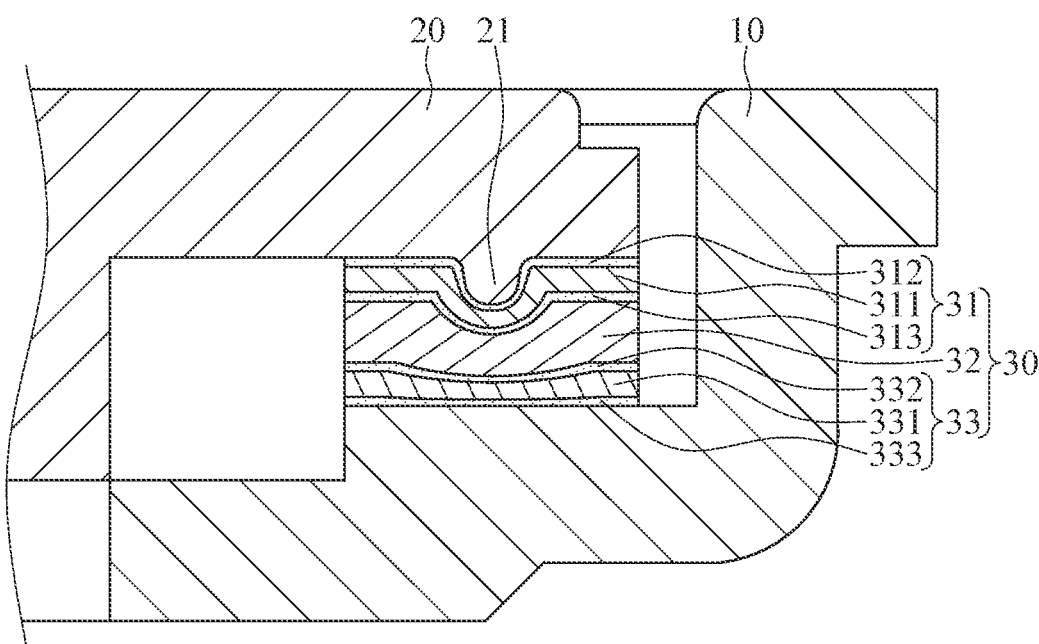
FIG. 5 illustrates a cross-sectional view of the electronic device according to the another embodiment of the present disclosure.

Next, please refer to FIG. 4 and FIG. 5. FIG. 4 illustrates an exploded partial view of an electronic device according to another embodiment of the present disclosure. FIG. 5 illustrates a cross-sectional view of the electronic device according to the another embodiment of the present disclosure. Likewise, it is understood that, in FIG. 5, for clearly showing the detail structures of the electronic device 100, the sectioned part of the waterproof element 30 is not illustrated by using actual proportions; instead, the detail structures of the waterproof element 30 at the sectioned part are illustrated in an exaggerated manner. In this embodiment, components which are identical to the previous embodiment are denoted by identical symbols, and the connections between components which are identical to the previous embodiment are described as above. The difference between this embodiment and the previous embodiment is that, in this embodiment, the waterproof element 30 is disposed on the casing 10.

The waterproof element 30 comprises a double-sided tape 31 and an elastic body 32. The double-sided tape 31 comprises a first substrate 311, a first adhesive layer 312, and a second adhesive layer 313, wherein the first adhesive layer 312 and the second adhesive layer 313 are coated on two opposite surfaces of the first substrate 311, respectively. The elastic body 32 is fixed on the casing 10, the elastic body 32 is adhered to the second adhesive layer 313, and the clastic body 32 is tightly fitted to the cover 20 repeatedly through the first adhesive layer 312.

Accordingly, when the cover 20 is to be covered and assembled at the opening 11, the cover 20 can be assembled on the opening 11 in a close-fit manner through the elastic body 32 of the waterproof element 30, and the double-sided tape 31 allows the elastic body 32 and the cover 20 to be closely mated with each other, so that the mating between the elastic body 32 and the cover 20 is almost seamless. Moreover, by allowing the elastic body 32 and the cover 20 to be closely fitted with each other through the double-sided tape 31, during the operation of the electronic device 100, the impact applied to electronic device 100, which may cause the displacement of the elastic body 32 to affect the waterproof performance, can be reduced. Moreover, because the first adhesive layer 312 is an adhesive member which can be repeatedly closely fitted to the cover 20, during repairing the electronic device 100 or repeatedly assembling/disassembling the cover 20, the repeatedly assembling/disassembling can be still achieved without causing the waterproof element 30 to be damaged which may be occur owing to the excessive adhesion strength of the first adhesive layer 312.

Next, please refer to FIG. 4 and FIG. 5. The cover 20 may have a close-fit structure 21, and the close-fit structure 21 is adapted to press the elastic body 32. In this embodiment, the close-fit structure 21 is a plurality of protruding ribs, and the protruding ribs surround an outer periphery of the cover 20 and are spaced apart from each other, and the protruding ribs forward press the elastic body 32 through the first adhesive layer 312. In some other embodiments, the close-fit structure 21 may be a structure completely surrounding the outer periphery of the cover 20. Therefore, by pressing the elastic body 32 with the close-fit structure 21, the contact between the elastic body 32 and the cover 20 can be achieved more closely.

Figure 6:
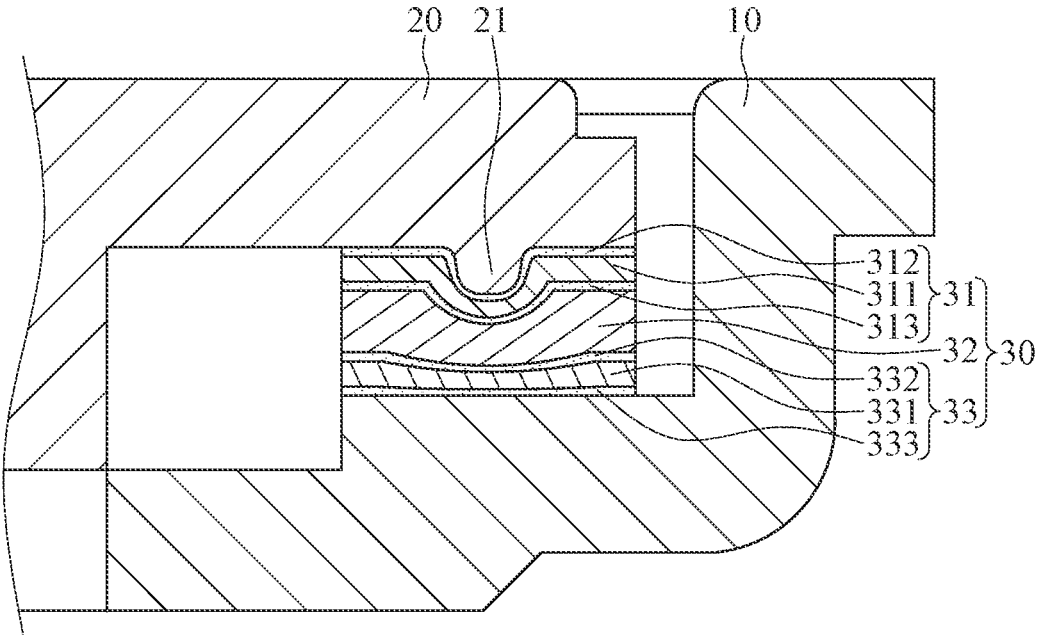
FIG. 6 illustrates a cross-sectional view of an electronic device according to yet another embodiment of the present disclosure.

Please refer to FIG. 6. FIG. 6 illustrates a cross-sectional view of an electronic device according to yet another embodiment of the present disclosure. This embodiment is provided as an exemplary embodiment for the shape of the protruding rib of the close-fit structure 21. For example, a lateral width of the protruding rib shown in FIG. 6 is greater than a lateral width of the protruding rib shown in FIG. 5. Therefore, through the configuration of protruding ribs with different shapes, different pressing forces for different usage scenarios can be provided. Alternatively, in some embodiments, the waterproof performance can be enhanced through the change of the contact area between the close-fit structure and the elastic body 32

The above embodiments are presented for detailed description, however, these embodiments are merely served as illustrative examples and do not limit the scope of the invention to be protected. In addition, some of the components are omitted from the drawings in the embodiments so as to clearly show the technical features of the present disclosure. In all drawings, identical symbols are used to denote identical or similar elements.

What is claimed is:
1. An electronic device comprising:
a casing having an opening;
a cover covered and assembled at the opening; and
a waterproof element comprising:

a double-sided tape comprising a first substrate, a first adhesive layer, and a second adhesive layer, wherein the first adhesive layer and the second adhesive layer are respectively coated on two opposite surfaces of the first substrate, the first adhesive layer has a first adhesion force, and the second adhesive layer has a second adhesion force different than the first adhesion force; and an elastic body fixed on the casing or the cover, wherein the elastic body is adhered to the second adhesive layer, and the elastic body is fitted to the cover or the casing repeatedly through the first adhesive layer.

2. The electronic device according to claim 1, wherein the elastic body is fixed on the cover, the elastic body is fitted to the casing repeatedly through the first adhesive layer, the first adhesion force is less than the second adhesion force, and the first adhesion force is adapted to allow the elastic body to be adhered to or peeled from the casing repeatedly through the first adhesive layer.

3. The electronic device according to claim 1, wherein the casing has a close-fit structure, the first adhesive layer contacts a planar surface of the casing, and the close-fit structure protrudes above the planar surface of the casing to press the elastic body.

4. The electronic device according to claim 3, wherein the close-fit structure is a protruding rib surrounding the opening, and the protruding rib forward presses the elastic body through the first adhesive layer.

5. The electronic device according to claim 1, wherein the waterproof element further comprises another double-sided tape, the another double-sided tape comprises a second substrate, a third adhesive layer, and a fourth adhesive layer, the third adhesive layer and the fourth adhesive layer are respectively coated on two opposite surfaces of the second substrate, the third adhesive layer is adhered to the elastic body, and the fourth adhesive layer is adhered to the cover.

6. The electronic device according to claim 5, wherein both an adhesion force between the third adhesive layer and the elastic body and an adhesion force between the fourth adhesive layer and the cover are greater than the first adhesion force.

7. The electronic device according to claim 1, wherein the elastic body is fixed on the casing, the elastic body is fitted to the cover repeatedly through the first adhesive layer, the first adhesion force is less than the second adhesion force, and the first adhesion force is adapted to allow the elastic body to be adhered to or peeled from the cover repeatedly through the first adhesive layer.

8. The electronic device according to claim 1, wherein the cover has a close-fit structure, the first adhesive layer contacts a planar surface of the cover, and the close-fit structure protrudes below the planar surface of the cover to press the elastic body.

9. The electronic device according to claim 8, wherein the close-fit structure is a plurality of protruding ribs, the plurality of protruding ribs surround an outer periphery of the cover and are spaced apart from each other, and the plurality of protruding ribs forward press the elastic body through the first adhesive layer.

10. The electronic device according to claim 1, wherein the elastic body is a foam or a rubber.

11. The electronic device according to claim 1, wherein a hardness of the elastic body is less than a hardness of the cover and less than a hardness of the casing.

12. The electronic device according to claim 1, wherein a top surface of the casing is coplanar with a top surface of the cover.

13. The electronic device according to claim 1, wherein a thickness of the elastic body, measured in a direction extending from the casing to a portion of the cover overlying the casing, at a middle of the elastic body is different than the thickness of the elastic body at an edge of the elastic body.

14. The electronic device according to claim 1, wherein the first adhesion force is less than the second adhesion force.

15. The electronic device according to claim 1, wherein the first adhesion force is 0.45±0.2 Kg/25 mm and the second adhesion force is greater than or equal to 1.3 Kg/25 mm.

16. The electronic device according to claim 5, wherein at least one of the third adhesive layer or the fourth adhesive layer has a third adhesion force, and the third adhesion force is greater than the first adhesion force.

17. The electronic device according to claim 3, wherein a bottom surface of the cover faces the close-fit structure, and a top surface of the cover, diametrically opposite the bottom surface, is coplanar with a top surface of the casing.

18. The electronic device of claim 1, wherein a first physical interface is defined between the first adhesive layer and the first substrate.

19. The electronic device of claim 18, wherein a second physical interface is defined between the first substrate and the second adhesive layer.

20. The electronic device of claim 3, wherein a bottom surface of the first substrate facing the close-fit structure is non-planar due to the close-fit structure.

* * * * *